United States Patent [19]

Nagami

[11] 4,442,365
[45] Apr. 10, 1984

[54] HIGH SPEED LATCH CIRCUIT

[75] Inventor: Akira Nagami, Tokyo, Japan

[73] Assignee: Nippon Electric Co., Ltd., Tokyo, Japan

[21] Appl. No.: 326,925

[22] Filed: Dec. 2, 1981

[30] Foreign Application Priority Data

Dec. 2, 1980 [JP] Japan .................................. 55-170071

[51] Int. Cl.³ ............................................ H03K 3/356
[52] U.S. Cl. ..................................... 307/279; 307/291; 307/443
[58] Field of Search ...................... 307/443, 453, 238.5, 307/238.8, 270, 279, 289, 575, 577, 475, 291

[56] References Cited

U.S. PATENT DOCUMENTS

| | | | |
|---|---|---|---|
| 3,641,360 | 2/1972 | Yao | 307/279 X |
| 3,832,578 | 8/1974 | Nomiya et al. | 307/279 |
| 3,846,643 | 11/1974 | Chu et al. | 307/279 X |
| 4,149,099 | 4/1979 | Nagami | 307/279 |
| 4,216,389 | 8/1980 | Carter | 307/238.3 X |

Primary Examiner—Larry N. Anagnos
Assistant Examiner—David R. Hudspeth
Attorney, Agent, or Firm—Laff, Whitesel, Conte & Saret

[57] ABSTRACT

A latch circuit has first to fourth nodes. The first node is supplied with a logic signal and the second node is charged at a first potential. A potential at the third node is discharged to the second potential. The fourth node is charged to the first potential. This all happens during a first period, after which, and during a second period, a potential at the second node is transferred to the third node. An inverter transistor is responsive to a level of the logic signal at the first node for discharging a potential of the second node to a second potential when the logic signal level is in the first potential and for retaining the first potential of the second node when the logic signal level is in the second potential. A transfer between the fourth and the first nodes is responsive to the second potential at the third node for discharging the potential of the fourth node to the second potential. A true and a complement signals of a large amplitude are established at the fourth and second nodes.

11 Claims, 14 Drawing Figures

HIGH SPEED LATCH CIRCUIT

The present invention relates to a latch circuit formed of semiconductor elements, and more particularly to an integrated latch circuit making use of insulated gate field effect transistors.

At present, among 64 K MOS dynamic RAM's, those of 5 V single power supply type are principally used. In these MCS dynamic RAM's, it becomes necessary to make provision such that at every circuit portion a utilization efficiency of a power supply should be raised as high as possible in comparison to the conventional 4 K or 16 K MOS dynamic RAM's of 12 V power supply type. Consequently, with regard to a circuit construction employed in each circuit block, it is required that a precharge potential should be a power supply level or a level that is lower than a power supply level by a threshold voltage of IGFET and that even in the case of receiving a differential input and amplifying it, the input level should be raised as high as possible, and therefore, varieties of the circuit construction would be limited. A latch circuit is one of the circuit constructions widely used in memory circuits and other MOS integrated circuits and is employed as an address buffer, data-in buffer, output buffer and the like. In a prior art latch circuit, an intermediate potential level between an input higher level and an input lower level is internally generated as a reference potential and a differentially amplified output is further amplified logically through a buffer circuit to obtain true and complementary outputs.

Therefore, the prior art latch circuit necessitates a reference voltage generator which should be met with troublesome requirements such as elimination of its dependency upon the threshold voltage of the transistor employed and suppression of the effect thereon, of variation in a power supply voltage. Further, the differentially amplified output per se cannot be used as the latch output and amplification should be performed through two stages of circuits, which requires an additional clock signals.

It is one object of the present invention to provide a latch circuit stably operative without a reference voltage.

It is another object of the present invention to provide a latch circuit operable at a high speed and with a smaller number of control signals.

It is still another object of the present invention to provide a circuit which can latch a difference signal having a large amplitude in response to an input signal by making use of a single activation timing signal.

It is still another object of the present invention is to provide an improved address inverter buffer circuit.

According to the present invention, there is provided a latch circuit comprising a first to a fourth nodes, means for supplying the first node with a logic signal, first charging means for operatively charging said second node at a first potential, means for operatively discharging a potential at the third node to the second potential, second charging means for operatively charging the fourth node at the first potential, first control means for operatively enabling the first and second charging means and the discharging means during a first period, first transfer means for operatively transferring a potential at the second node to the third node, second control means for operatively enabling the first transfer means during a second period after the first period, inverter transistor means responsive to a level of the logic signal at the first node for discharging a potential of the second node to a second potential when the logic signal level is in the first potential and retaining the first potential of the second node when the logic signal level is in the second potential and a second transfer means coupled between the fourth and the first nodes and responsive to the second potential at the third node for discharging the potential of the fourth node to the second potential. A true and a complement signals of a large amplitude are established at the fourth and second nodes.

According to more detailed aspect of the present invention, there is provided a semiconductor circuit comprising a first capacitor having its one terminal connected to a first node, precharge means for the first node; a first insulated gate field effect transistor (hereinafter abbreviated as IGFET) having its drain connected to the first node, its gate connected to a first activation clock and its source connected to a second node, a second IGFET having its drain connected to the second node, its gate connected to a first TLL-level input and its source connected to a first power supply, reset means for the second mode, a second capacitor having its one terminal connected to a third node, precharge means for the third node, a third IGFET having its drain connected to the third node, its gate connected to the second node and its source connected to the first power supply, a fourth IGFET having its drain connected to the third node, its gate connected to the first activation clock and its source connected to a fourth node, reset means for the fourth node, a fifth IGFET having its drain connected to the second node, its gate connected to the fourth node and its source connected to a fifth node, and precharge means for the fifth node. In response to activation of the first activation clock, the first TTL-level input at that moment is latched, and a difference signal having a large amplitude can be generated at the third node and the fifth node such that the third node may take a higher potential when the latched input is at a higher level but the fifth node may take a higher potential when the latched input is at a lower level.

The above-mentioned and other features and objects of the present invention will become more apparent by reference to the following description of preferred embodiments of the invention taken in conjunction with the accompanying drawings.

Throughout the following specification, description will be made by employing MOS transistors (hereinafter called MOST's) which are representative ones of the insulated gate field effect transistor, and especially by employing N-channel MOST's. Therefore, it is assumed that a higher level is a logic "1" level and a lower level is a logic "0" level. However, with regard to circuit constructions, the situation is essentially identical even if P-channel MOST's are employed.

Figure 1:
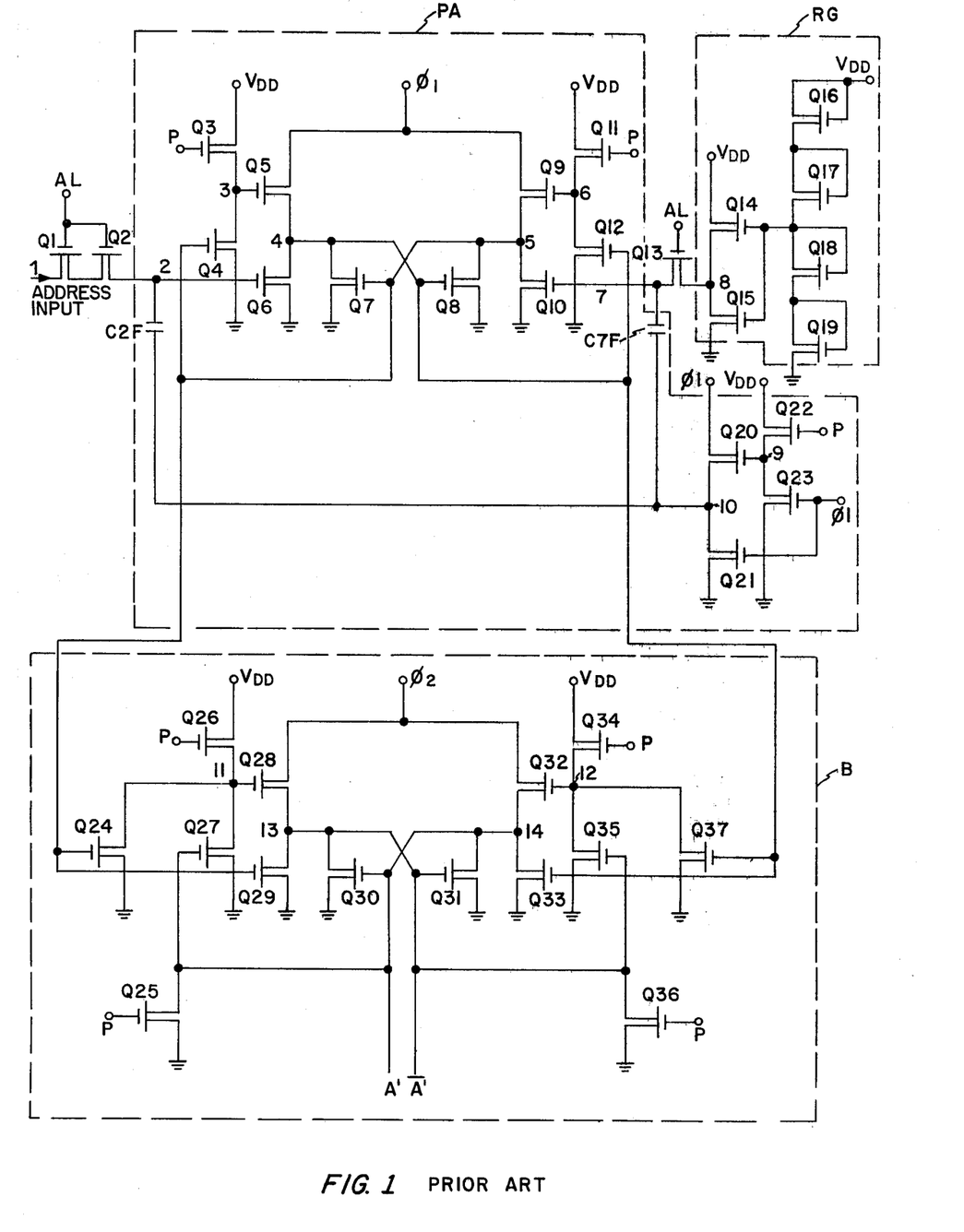
FIG. 1 is a circuit diagram of a prior art latch circuit used as an address inverter buffer in a dynamic RAM.
Figure 2:
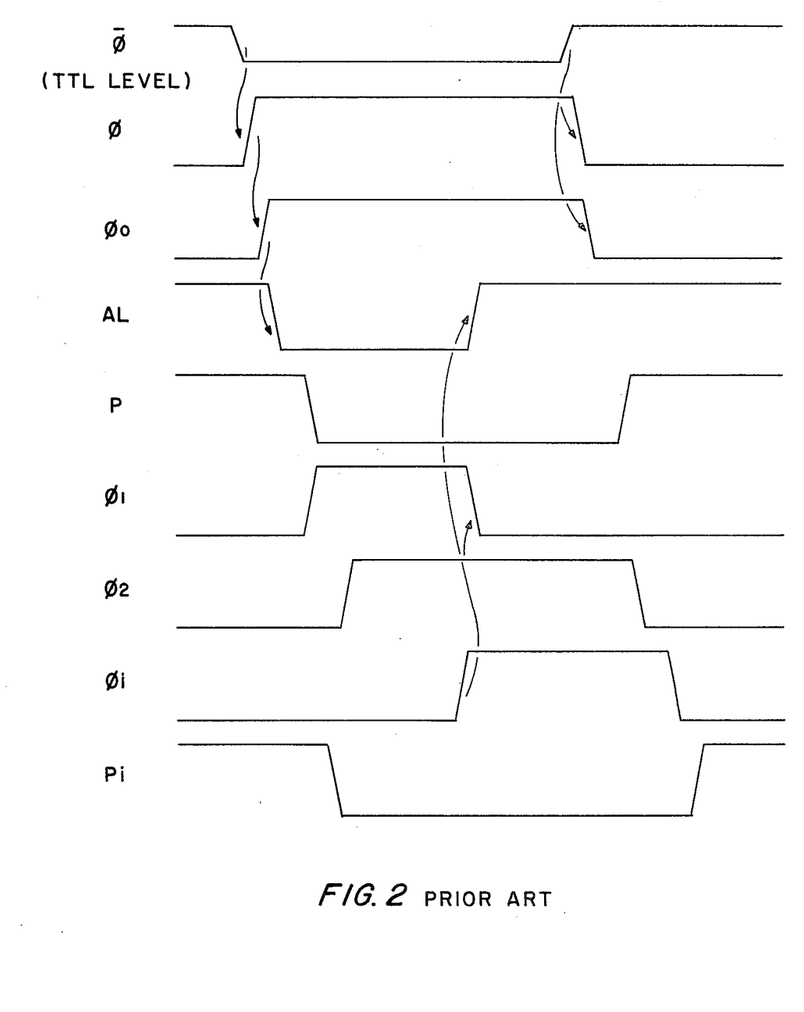
FIG. 2 is a waveform diagram of clock signals used in the RAM including the circuit of FIG. 1.

Referring to FIGS. 1 and 2, the prior art latch circuit used as an address inverter buffer in the conventional dynamic RAM of 5 V single power supply type will be further described in more detail. The latch circuit, as shown in FIG. 1, includes a pre-amplifier stage PA, a reference voltage generator circuit RG, and a buffer stage B. The pre-amplifier stage PA is activated by a clock signal $\phi_a$, which is anticipated by other timing signals P and AL and primarily started by an external clock input $\overline{\phi}$ received by the RAM. Referring also to FIG. 2, when the external clock input $\overline{\phi}$ at a TTL level changes from a higher level to a lower level, the RAM circuit enters from a reset precharge state into an active state. A timing signal $\phi$ is generated in response to $\overline{\phi}$ and another timing signal $\phi_0$ which primarily defines an active state is also generated in response to $\phi$. Then two signals $\phi$ and $\phi_0$ are not employed in the latch circuit of FIG. 1. In response to the rise of the timing signal $\phi_0$, a timing signal AL falls to the ground potential. This timing AL is a timing signal for latching an address input signal and a reference potential. Before its fall to the ground potential, AL makes MOST's $Q_1$, $Q_2$ and $Q_{13}$ conductive and an address signal at the address input terminal 1 is latched at a node 2 via MOST's $Q_1$ and $Q_2$ and a reference potential generated at a node 8 by the reference voltage generator RG is latched at a node 7 via a MOST $Q_{13}$. MOST's $Q_{14}$ to $Q_{19}$ form a reference voltage generator circuit RG, and since the rated values of the minimum of the higher level and the maximum of the lower level of the address input signal are 2.2 V and 0.8 V, respectively, the center of the reference level is set at 1.5 V. Also, by the precharge timing P, MOST's $Q_3$, $Q_{11}$, $Q_{22}$, $Q_{26}$, and $Q_{34}$ are made conductive and nodes 3, 6, 9, 11 and 12 are precharged to a high level. After the fall of AL, the precharge timing P is lowered to the ground potential, and an activation timing signal $\phi_1$ rises up to a high level. In response to the timing $\phi_1$, the pre-amplifier stage PA of the address inverter buffer starts to operate. Although a node 10 rises in level by $\phi_1$ applied via a MOST $Q_{20}$, MOST's $Q_{21}$ and $Q_{23}$ become conducting at the same time and immediately lower the level of the node 13 to the ground potential. Therefore, the node 13 is raised in potential in a spike form as synchronized with the rise of $\phi_1$. Boot-strap capacitors $C_{2F}$ and $C_{7F}$ have equal capacitances, so that the nodes 2 and 7 rise in level in a spike form by the same amount. On the other hand, in response to the timing $\phi_1$, the nodes 4 and 5 tend to rise via MOST's $Q_5$ and $Q_9$, respectively. While, gate levels of MOST's $Q_6$ and $Q_{10}$ keep the potential difference between the address signal potential and reference potential, and thus a difference arises in a current capacity between MOST's $Q_6$ and $Q_{10}$. Accordingly, a drain node of a MOST ($Q_6$ or $Q_{10}$) having a lower gate level rises higher than the other. When the address input signal is at a lower level, the node 4 is raised earlier, but when it is at a higher level, the node 5 is raised earlier. When one of the nodes 4 and 5, for instance, the node 4 in case of the address input signal at a lower level, exceeds a threshold voltage, MOST's $Q_8$ and $Q_{12}$ become conducting to suppress the node 5 to a lower level and to discharge the node 6 for making the MOST $Q_9$ non-conducting, and after all the node 5 is lowered to the ground potential. On the other hand, the node 4 rises while following the timing $\phi_1$ owing to a self boot effect of the MOST $Q_5$. In this way, an output of a preamplifier PA appears at the nodes 4 and 5. It is desirable to use this output as an address output to be supplied to a decoder of NOR-gate type. However, it is impossible. Assuming that the minimum reference potential (1.5 V) is set at the center of the difference between the gate levels (2.2 V and 0.8 V) of the MOST's $Q_6$ and $Q_{10}$, the difference between the minimum reference potential and the gate level becomes 2.2−1.5=0.7 V or 1.5−0.8=0.7 V. Since the reference potential would normally vary by about 0.3 V per 1 V of the $V_{DD}$ level, the difference may possibly become 0.4 V or less. As the difference is reduced, the rise of the output on the lower level side becomes large, and hence in the case of a NOR-gate type decoder, there occurs a risk that even a selected decoder is also discharged and is thus deemed to be unselected. Therefore, normally the output of the preamplifier PA is supplied to an additional one stage of a buffer B, through which address outputs are derived. A short time after the rise of the timing $\phi_1$, a timing $\phi_2$ is generated to rise up to the $V_{DD}$ level, and thereby the buffer section B starts to operate. Since the nodes 11 and 12 have been precharged to conduct MOST's $Q_{28}$ and $Q_{32}$, nodes 13 and 14 which serve as address outputs tend to rise, respectively, by $\phi_2$ via MOST's $Q_{28}$ and $Q_{32}$. The operation of the preamplifier PA has been already completed at this time, and therefore one of the gate levels of the MOST's $Q_{29}$ and $Q_{33}$ is held at the ground potential, while the other is held at the $V_{DD}$ level or a level close to the $V_{DD}$ level. For example, when the address input is at a lower level, the node 4 is held at the $V_{DD}$ level, while the node 5 is held at the ground potential, and therefore MOST's $Q_{33}$ and $Q_{37}$ are conducting to discharge the node 12 and to make the node 14 at the ground potential. On the other hand, the node 13 rises up to the $V_{DD}$ level, following the timing $\phi_2$ via MOST $Q_{28}$. As a result, the output of the buffer stage B, that is, a complementary output $\overline{A}'$ of high level and a true output A' of the ground potential, can be attained at the nodes 14 and 13. After the output of the buffer stage B is thus established, a timing $\phi_i$ is generated to terminate the timing $\phi_1$ and restore the timing AL. This is because the timing $\phi_1$ makes a D.C. current flow via MOST's $Q_9$ and $Q_{10}$ in the preamplifier PA when the address input is at a high level and the MOST $Q_{10}$ is conducting by the reference potential supplied to its gate. In order to prevent this D.C. current from flowing over the entire active period, the timing $\phi_1$ is lowered to the ground potential by the activation timing $\phi_i$ which is generated at a later moment.

The address inverter buffer circuit shown in FIG. 1 which operates in the above-described manner has been generally employed in the conventional dynamic RAM of 5 V single power supply type, but it has the following problems:

(1) Since an address input is latched at the node 2 via the MOST's $Q_1$ and $Q_2$, it is difficult to guarantee an input setup time such as 0 mS, −5 mS or −10 mS.

(2) A reference voltage generator circuit RG is necessarily employed, which is associated with troublesome requirements such as elimination of dependency upon a threshold voltage of MOST's and suppression of dependency upon the $V_{DD}$ power supply level.

(3) Since an address input and a reference level are in themselves applied to the latch nodes 2 and 7 of the preamplifier PA and the difference therebetween is not amplified, there is a risk that at the preamplifier outputs 4 and 5 the potential on the lower level side may be possibly raised higher than the threshold voltage, and therefore, they are in themselves hardly used as address outputs.

(4) To solve the difficulty of the item (3) above, two stage construction consisting of the preamplifier stage PA and the buffer stage B is necessitated, and two activation clocks ($\phi_1$, $\phi_2$) become necessary.

(5) When an address input is at a higher level a D.C. current path is established from the timing $\phi_1$ through the MOST's $Q_9$ and $Q_{10}$ and it is necessary to lower the timing $\phi_1$ to the ground potential in the latter half of the active period. However, when an address input is at a lower level there is no such problem. Therefore, it is said that this preamplifier is asymmetric in operations in response to an input higher level and an input lower level.

Now referring to FIG. 3, a latch circuit according to the present invention will be described. The latch circuit of this embodiment comprises MOST's $Q_{101}$, $Q_{102}$ and $Q_{103}$ connected in series at nodes 101 and 102 between two terminals of a power supply, $V_{DD}$ and the ground, a MOST $Q_{104}$ connected between the node 102 and the ground, a MOST $Q_{105}$ connected between the node 102 and a node 105, MOST's $Q_{106}$ and $Q_{107}$ connected in series at a node 103 between $V_{DD}$ and the ground, MOST's $Q_{108}$ and $Q_{109}$ connected in series at a node 104 between the node 103 and the ground, a MOST $Q_{110}$ connected between $V_{DD}$ and the node 105, a capacitor C1A connected between the node 101 and the ground, and a capacitor C3A between the node 103 and the ground. The gates of the MOST's $Q_{101}$, $Q_{104}$, $Q_{105}$, $Q_{109}$ and $Q_{110}$ are connected to a terminal of a precharge timing signal $P_{os}$. The gates of the MOST's $Q_{102}$ and $Q_{108}$ are connected to a terminal of an activation timing signal $\phi_0$. The gates of the MOST's $Q_{105}$ and $Q_{107}$ are connected to the nodes 104 and 102, respectively. An input terminal is connected to the gate of the MOST $Q_{103}$ and the nodes 103 and 105 serve as true and complementary output terminals of the latch circuit. These output terminals may be connected to MOST's $Q_{111}$ and $Q_{112}$ of a drive circuit, The operation of this latch circuit will be explained with reference to FIG. 4 which shows changes in potential levels at the nodes 101 to 105. The waveforms on the left-hand side in FIG. 4 are in case of a high level input, while those on the right-hand side in case of a low level input. In this example, a precharge timing $P_{os}$ of one-shot type is used, which precharges the nodes 101, 103 and 105 to a ($V_{DD}$-threshold voltage) level and resets the nodes 102 and 104 to the ground potential when it is made at a high level ($V_{DD}$) during a reset/precharge period. Thereafter, it shifts to a low level in the same reset/precharge period. Accordingly, at the time point when the circuit enters an activation period, the nodes 101 to 105 maintain their respective levels under a high-impedance state. When the activation timing $\phi_0$ rises, MOST's $Q_{102}$ and $Q_{108}$ become conducting and electric charges at the nodes 101 and 103 is respectively transferred to the nodes 102 and 104. In the case where the input is at a low level, all these nodes 101 to 104 are brought to a level ($V_{DD}$-threshold voltage-$\alpha$) that is a little lower than the ($V_{DD}$-threshold voltage) level. For the purpose of making this resultant level as high as possible, it is necessary to make the nodes 101 and 103 have far larger capacitances than the nodes 102 and 104, respectively. The additional capacitors C1A and C3A are provided for that purpose. When the MOST $Q_{107}$ becomes conducting in response to potential rise at the node 102, the node 103 is discharged through the MOST $Q_{107}$ and the node 104 is also discharged through MOST $Q_{108}$, the node 103 and MOST $Q_{107}$, both brought to the ground potential. During this active period, a MOST $Q_{105}$ turns from a saturated state to a non-conducting state, and hence the node 105 is maintained at the precharge potential, that is, at the ($V_{DD}$-threshold voltage) level. This is because after the nodes 102 and 104 have been simultaneously raised to nearly the same level in response to the rise of the timing $\phi_0$, the node 104 falls to the ground potential. Thus the low and the high levels of the nodes 103 and 105 are established as latched outputs. Accordingly, a large difference signal between the ground potential at the node 103 and the ($V_{DD}$-threshold voltage) level at the node 105, can be obtained. Under this state, even if the input should change from a lower level to a higher level, provided that the change has occurred after the MOSt $Q_{105}$ became non-conducting, it influences nothing upon the nodes 103 and 105. Therefore, this moment when the MOST $Q_{105}$ becomes non-conducting, would determine an input hold time.

On the other hand, in the case where the input is at a higher level, when the activation timing $\phi_0$ rises, MOST's $Q_{102}$ and $Q_{103}$ become conducting and the node 102 held at the ground potential is connected to the ground potential, the node 101 being discharged and brought to the ground potential. At the same time, the MOST $Q_{108}$ becomes conducting and the nodes 103 and 104 shift to the ($V_{DD}$-threshold voltage-$\alpha$) level, and since the MOST $Q_{107}$ is kept non-conducting, no further change would occur. When the MOST $Q_{105}$ becomes conducting in response to the rise of the level at the node 104, the node 105 is discharged through the MOST's $Q_{105}$ and $Q_{103}$, and hence it is brought to the ground potential. Accordingly, in this case also, the output node 103 takes the ($V_{DD}$-threshold voltage-$\alpha$) level, while the other output node 105 takes the ground potential, and thus a large difference in the output signals can be obtained. It is only necessary to maintain the input at a higher level until the node 105 is discharged, and this moment determines an input hold time. Therefore, a latched output having a large amplitude in response to an input can be obtained between the nodes 103 and 105 by making use of a single activation clock $\phi_0$.

Figure 3:
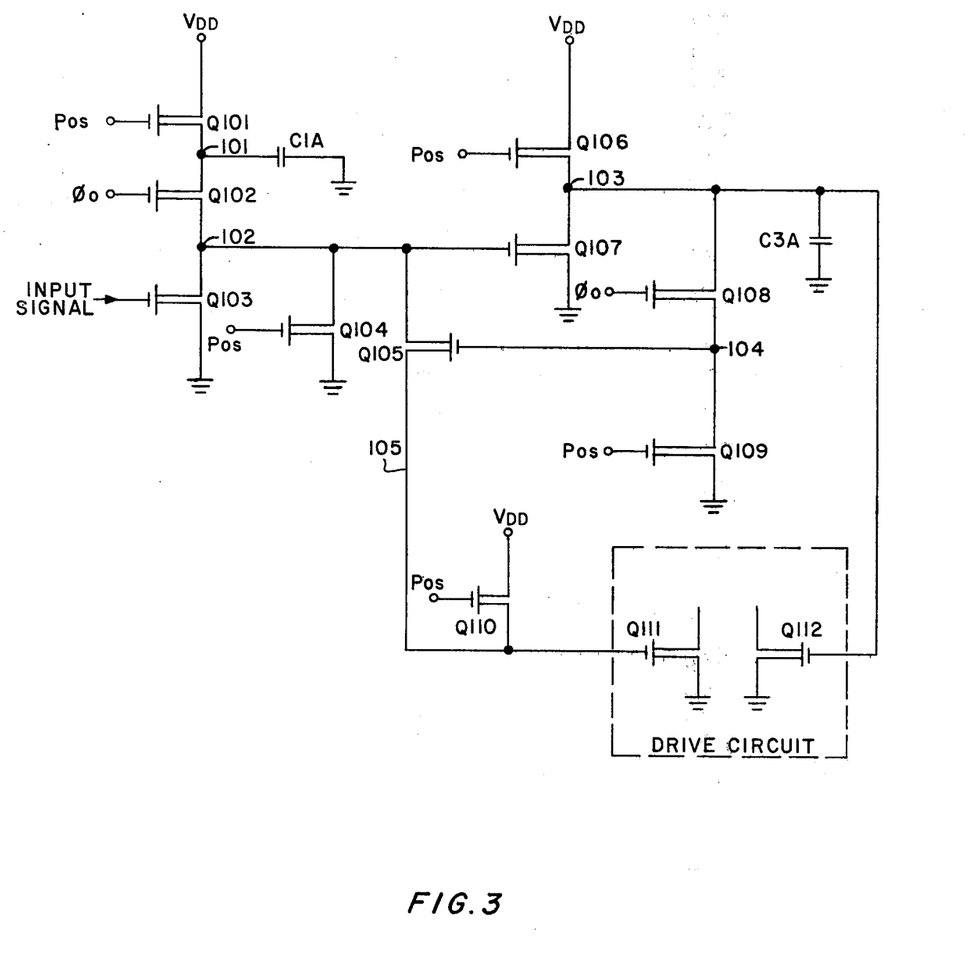
FIG. 3 shows a latch circuit according to a first embodiment of the present invention.
Figure 4:
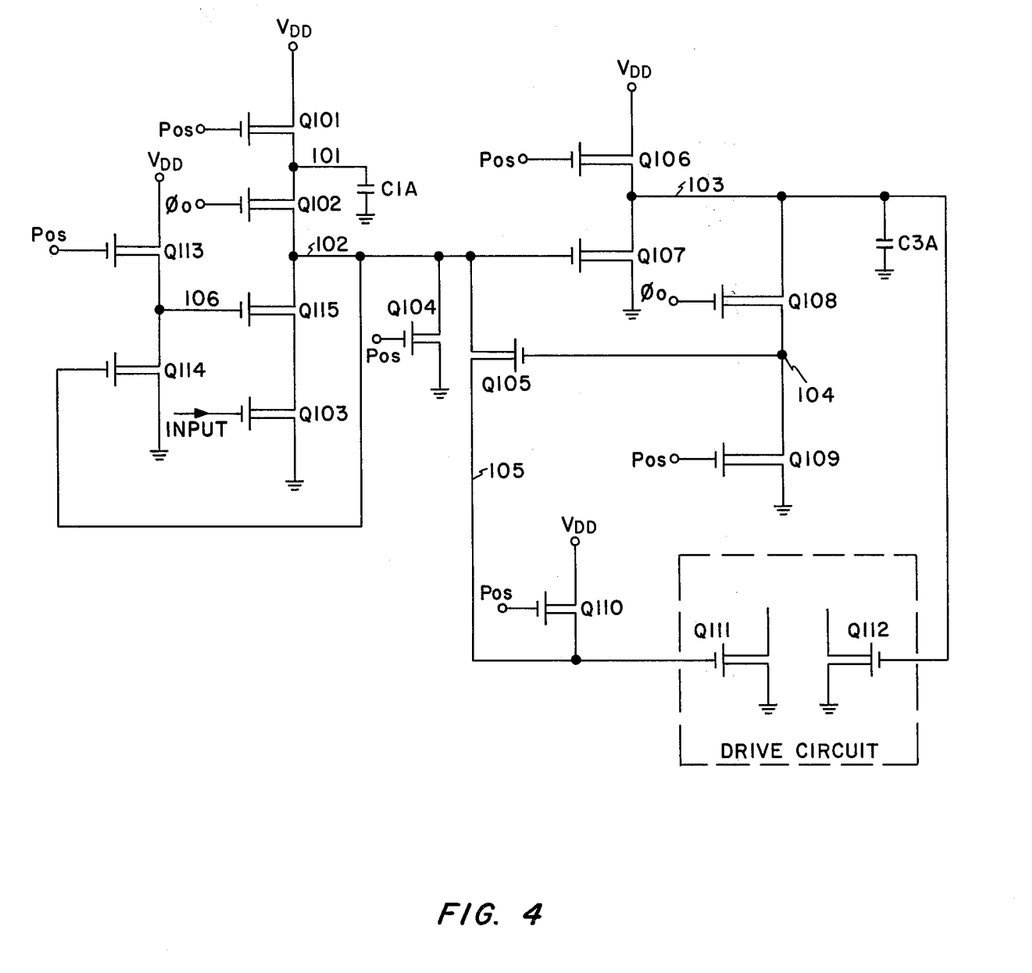
FIG. 4 shows a latch circuit according to a second embodiment of the present invention.
Figure 5:
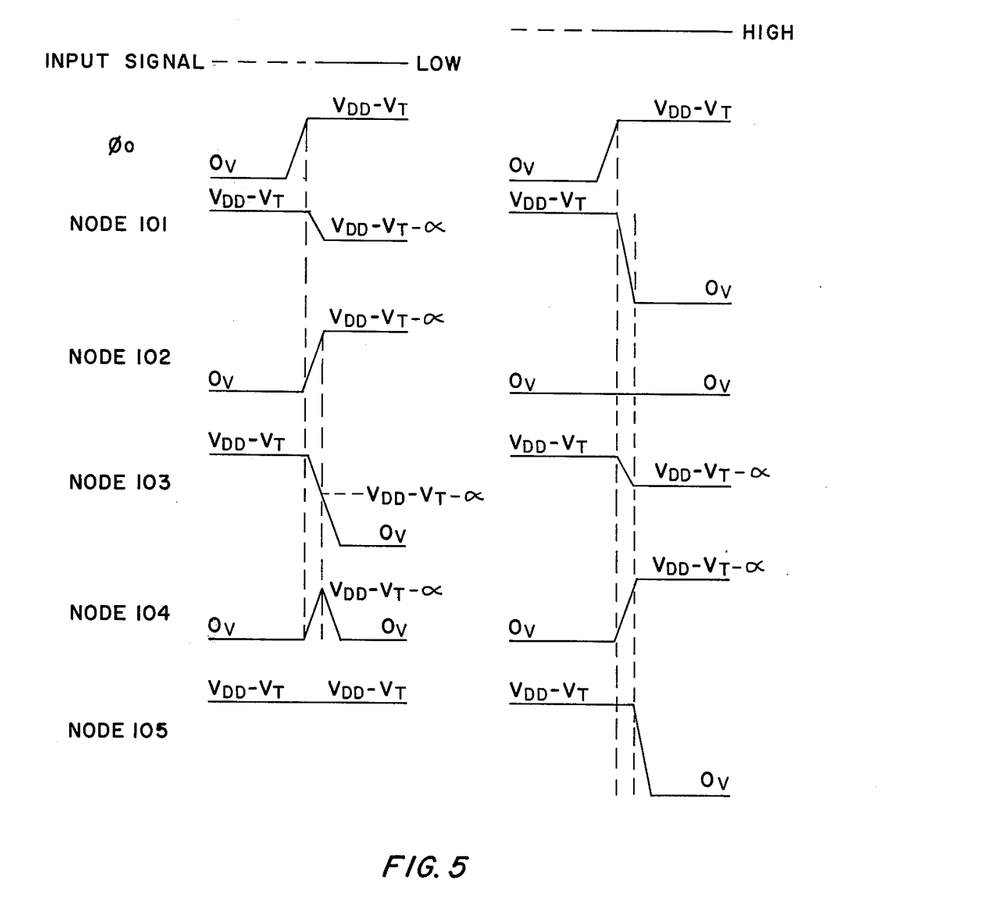
FIG. 5 shows changes in potential levels at principal nodes of the circuit shown in FIG. 3.

In the latch circuit shown in FIG. 3, the latch operation in the case that the input is at a lower level is relatively slow. Another embodiment of the present invention shown in FIG. 5 provides a latch circuit in which the latch operation is made faster. The latch circuit of FIG. 5 comprises, in addition to the latch circuit of FIG. 3, MOST $Q_{113}$ and $Q_{114}$ connected in series at a node 106 between $V_{DD}$ and the ground, and MOST $Q_{115}$ connected between the node 102 and the MOST $Q_{103}$ in series with the MOST's $Q_{101}$, $Q_{102}$ and $Q_{103}$. The gates of the MOST's $Q_{114}$ and $Q_{115}$ are connected to the nodes 102 and 106, respectively. The gate of the MOST $Q_{113}$ is supplied with the precharge timing $P_{os}$. In the case that the input is at a lower level, when the activation $\phi_0$ rises, electric charge at the node 101 is transferred to the node 102. When the node 102 exceeds the threshold voltage, the MOST $Q_{114}$ becomes conducting, and hence the node 106 is discharged and brought to the ground potential. Then, the MOST $Q_{115}$ becomes non-conducting, and the node 102 is completely isolated from the input while it is maintained at the ($V_{DD}$-threshold voltage-$\alpha$) level. Accordingly, the input can be latched substantially at the moment when the node 102 rises. Thus, this latch circuit operates faster than that shown in FIG. 3. The subsequent operations are not different from those of the circuit of in FIG. 3. In the case that input is at a higher level also, the operations of this circuit are quite the same as the operations of the circuit of FIG. 3 except for the fact that the electric charge at the node 101 is discharged through a path consisting of MOST's $Q_{102}$, $Q_{115}$ and $Q_{103}$, while the electric charge at the node 105 is discharged through a path consisting of MOST's $Q_{105}$, $Q_{115}$ and $Q_{103}$.

Figure 6:
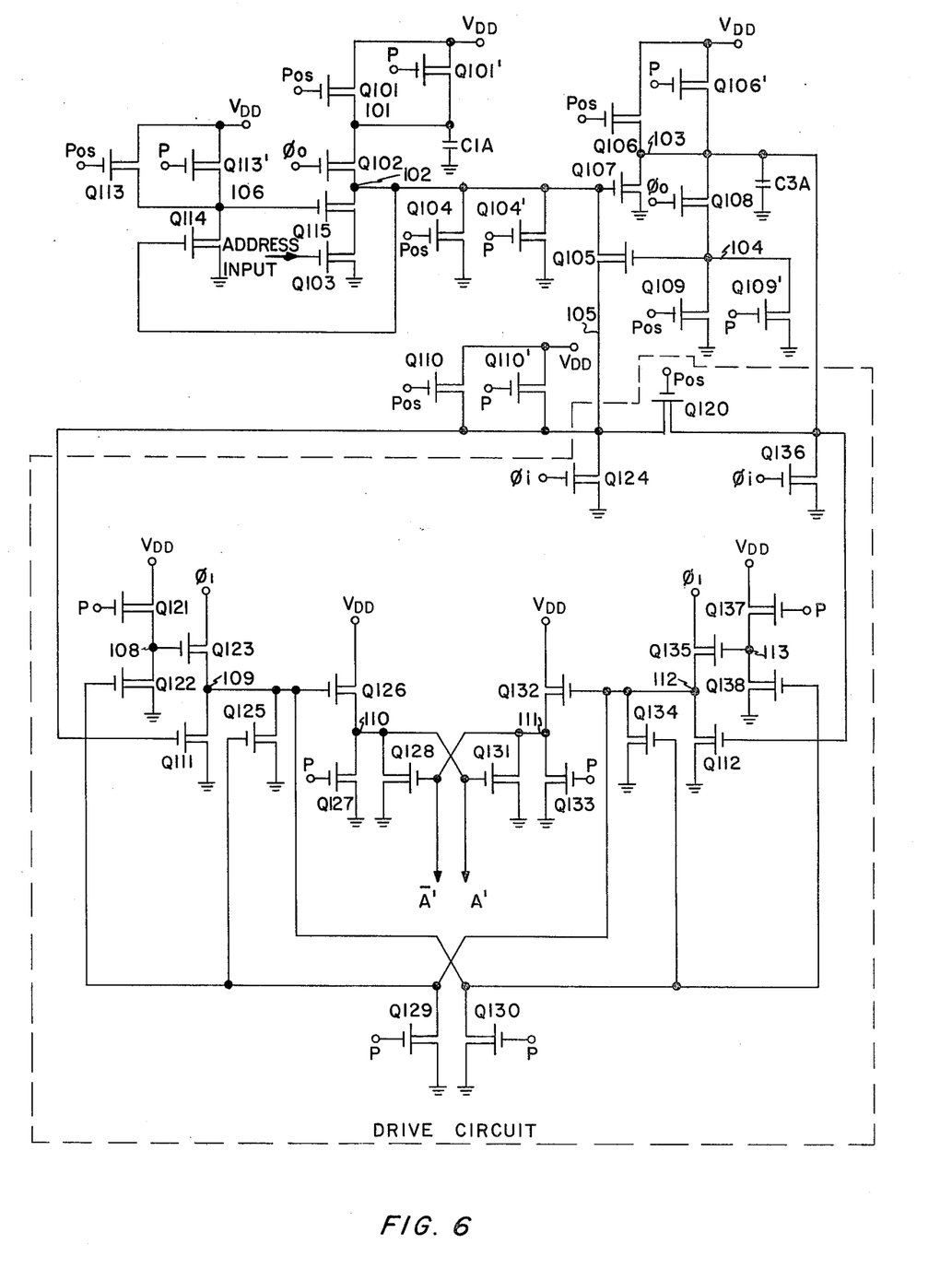
FIG. 6 is a circuit diagram of an address inverter buffer employing a latch circuit according to the present invention.

A practical application of the latch amplifier circuit according to the present invention is shown in FIG. 6, as applied to an address inverter buffer circuit. The buffer circuit of FIG. 6 comprises the latch circuit of the embodiment of FIG. 5 consisting of the MOST's $Q_{101}$ to $Q_{115}$ and the capacitors $C_{1A}$ and $C_{3A}$ and further having precharge transistors $Q_{101'}$, $Q_{104'}$, $Q_{106'}$, $Q_{109'}$, $Q_{110}$, and $Q_{113}$ additionally connected in parallel with the respective MOST's $Q_{101}$, $Q_{104}$, $Q_{106}$, $Q_{109}$, $Q_{110}$, and $Q_{113}$. The added precharge MOST's receives at their gates a precharge timing P. The buffer circuit further comprises a drive circuit having MOST's $Q_{120}$ to $Q_{138}$ in addition to the MOST's $Q_{111}$ and $Q_{112}$ whose gates are connected respectively to the output nodes 105 and 103 of the latch circuit.

Figure 7:
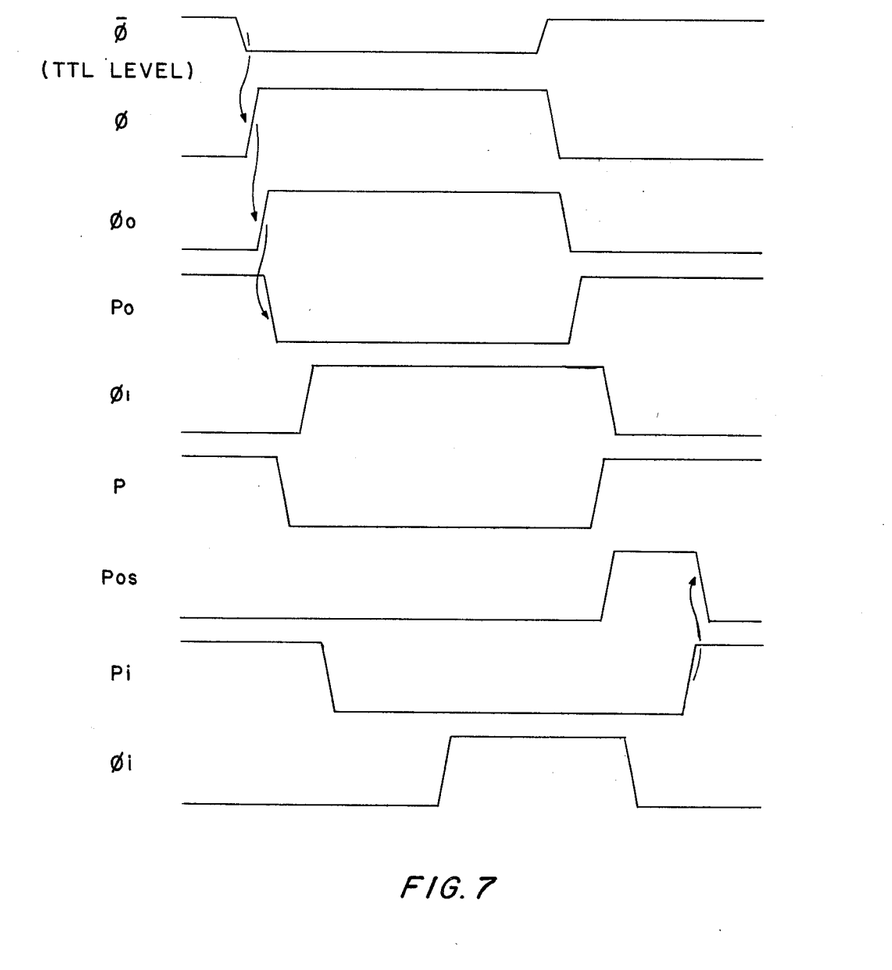
FIG. 7 is a waveform diagram of clock signals used in the circuit of FIG. 6.

Referring also to FIG. 7, the nodes 101, 103, 105 and 106 of the latch circuit and nodes 108 and 113 of the drive circuit are precharged by the one-shot precharge timing $P_{os}$ and a recharge timing P. Also, by these timings, the nodes 102 and 104 of the latch circuit and nodes 109, 110, 111 and 112 of the drive circuit are discharged to the ground level. In response to the rise of the activation timing signal $\phi_0$, the operation of the latch circuit starts. If the address input signal at the gate of the MOST $Q_{103}$ is of a low level, the node 103 turns to the ground potential and the node 105 takes the level of $V_{DD}$-(threshold level), and vice versa if the address input signal is of a high level, as described in the foregoing with respect to the latch circuits of FIGS. 3 and 5. Thus, latch amplification operation is completed and a large difference in level is established between the output nodes 103 and 105. Then, the timing signal $\phi_1$, rises until it reaches the $V_{DD}$ level, enabling the operation of the drive circuit. If the address input has been at a low level, the latch output node 103 is kept at a level close to the ground potential and 105 at a level of $V_{DD}$-(threshold voltage), and therefore the MOST $Q_{112}$ of the drive circuit is nonconducting and $Q_{111}$ conducting. Accordingly, the timing signal $\phi_1$, raises a level of the node 112 via a MOST $Q_{135}$ which is conducting by the precharged level at its gate node 113, while the conducting MOST $Q_{111}$ suppresses the node 109 to a lower level. The raised level at the node 112 turns MOST's $Q_{122}$ and $Q_{125}$ to conducting, thereby discharging the node 108, turning "OFF" MOST $Q_{123}$, and bringing the node 109 to the ground potential. It also turns "ON" MOST $Q_{132}$, that is a level of a node 111. As a result, the node 111, a complementary output $\overline{A'}$, reaches a level of $V_{DD}$ minus threshold voltage and makes MOST $Q_{128}$ conducting to hold the node 110, a true output $A'$, at the ground potential. After completion of the operation of the address inverter buffer, a timing signal $\phi_i$ is generated and applied to MOST's $Q_{124}$ and $Q_{136}$ to discharge the latch output nodes 103 and 105, in order to prevent such an undesirable situation from occurring that if an address input hold time is too short, the node 103 or the node 105 may be insufficiently discharged not to reach a complete low level.

The problems (1) through (5) enumerated in connection to the prior art latch circuit used as an address inverter buffer of FIG. 1 are resolved in the address inverter buffer of FIG. 6, in the following manner:

(1) Since an address input is directly applied to the gate of the MOST $Q_{103}$, the problem of the setup time would not arise.

(2) A reference voltage generator is unnecessary.

(3) In response to an address input, a large difference in level is established between the nodes 103 and 105 only by application of the early activation timing which is solely used in the prior art circuit to generate the superfluous timing AL.

(4) An additional activation timing $\phi_2$ is not needed.

(5) No D.C. current patch exists.

The timing signals employed in the address inverter buffer of FIG. 6 and illustrated in FIG. 7 are generated by the timing generator circuits shown in FIGS. 8(A) to 8(G), in the manner described below.

Figure 8:
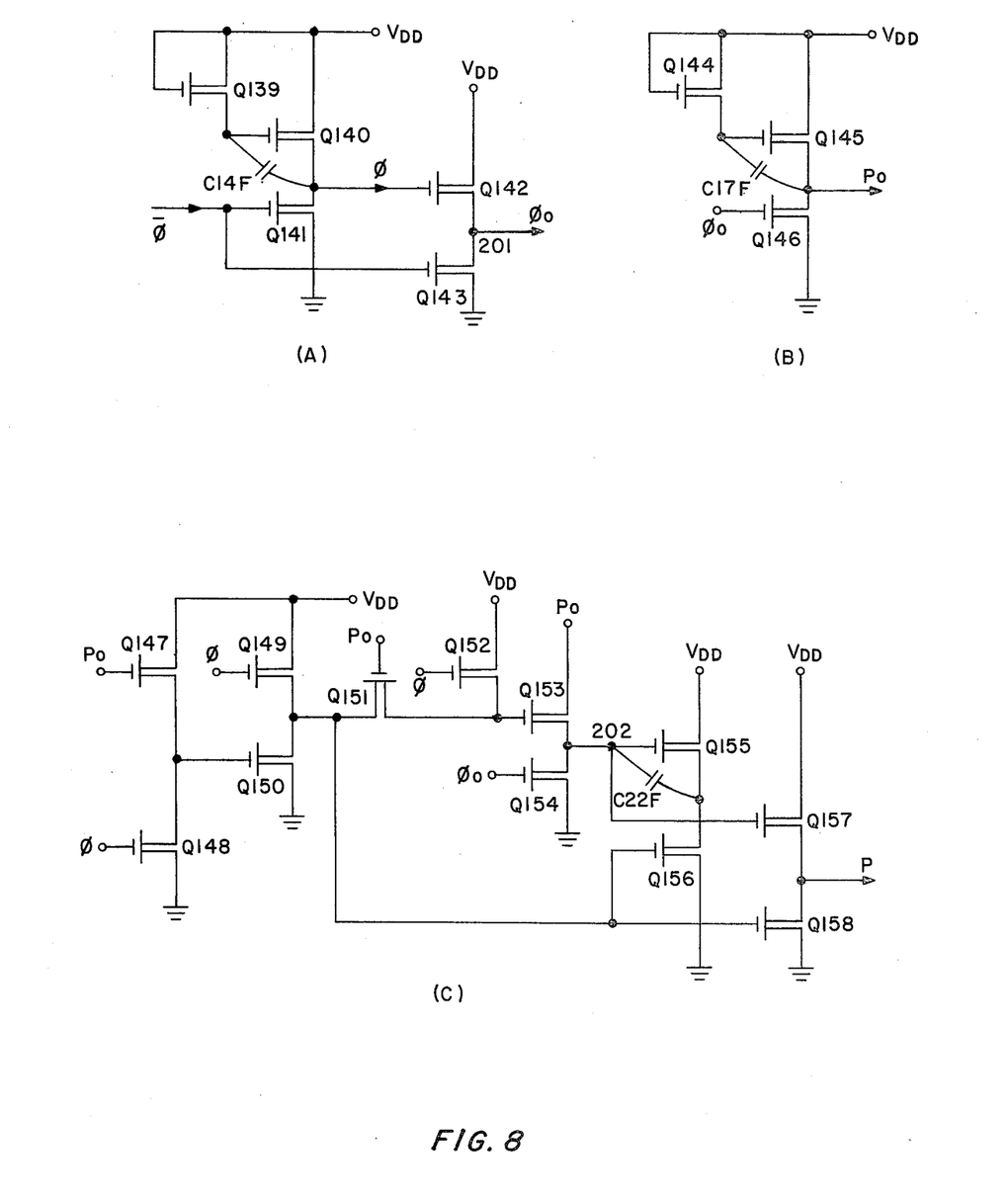
FIGS. 8A to 8G show drive timing generator circuits for clock signals shown in FIG. 7.

When an external input clock $\overline{\phi}$ of a TTL-level applied to a timing generator circuit of FIG. 8(A) changes from a high level to a low level, a MOST $Q_{141}$ becomes non-conducting and a first stage timing $\phi$ rises up to the $V_{DD}$ level through a MOST $Q_{140}$ driven in an unsaturated region. In a source-follower consisting of a MOST $Q_{142}$, the level of a node 201, a timing $\phi_0$, follows the rise of the gate level $\phi$ and rises up to a level of $V_{DD}$-(threshold voltage). During the period of the external input clock $\phi$ being at a high level, i.e., the reset precharge period, a D.C. current flows via MOST's $Q_{140}$ and $Q_{141}$. This current should be suppressed at a rated value as a stand-by current, and accordingly the current capacity for the MOST $Q_{140}$ is made small. Therefore, the timing signal $\phi$ is satisfactorily used only for a first timing activation and precharge. While the timing $\phi_1$ has a larger margin to a load capacity to be driven, but its use is restricted because of its high level equal to the ($V_{DD}$ minus threshold voltage) level. In the latch amplifier circuit of the present invention, the timing $\phi_0$ merely serves to transfer electric charges at the nodes 101 and 103, and therefore it can be used without any difficulty.

In response to the rise of the timing $\phi_0$, a timing $P_0$ turns to a low level by the generator circuit of FIG. 8(B), because the current capacity of a MOST $Q_{146}$ is far larger than that of a MOST $Q_{145}$.

At the same time, a MOST $Q_{154}$ of the generator circuit of FIG. 8(C) receiving $\phi_0$ at its gate becomes conducting, and a node 202 which has been held at a high impedance and at a far higher level than $V_{DD}$ is discharged, while a MOST $Q_{158}$ becomes conducting in response to a source-follower level of a MOST $Q_{149}$ whose gate is supplied with the timing $\phi$. As a result a timing P is lowered to the ground potential. In response to fall of the timing $\phi_0$, the timing $P_0$ shifts to a high level, and subsequently the timing P shifts to a high level.

The timing $P_i$ is generated by delaying the timing P, as shown in FIG. 8(D). The one-shot precharge timing $P_{os}$ is held at the ground potential during the active period, and raised by the rise of the timing P applied to a MOST $Q_{161}$ of the generator circuit of FIG. 8(E) and turned to the ground potential by the rise of the delayed timing $P_i$. In the reset/precharge period after the timing $P_{os}$ has fallen, the nodes 101 to 106 in the latch circuit of FIGS. 5 and 6 are floating and may be affected by other nodes. Therefore, in the latch circuit of FIG. 6, these nodes are fixed by the timing $P_o$ to the respective levels via MOST's $Q_{101'}$, $Q_{104'}$, $Q_{106'}$, $Q_{109'}$, $Q_{110'}$ and $Q_{113'}$ connected in parallel thereto. Current capacities of these MOST's are small to such extent that they may not adversely affect the circuit operation.

The timings $\phi$, $\phi_o$, $P_o$ and P are applied to the $\phi_1$, generator circuit of FIG. 8(F). A node 203 is charged via a MOST $Q_{167}$ by the timing $\phi$. When the timing $\phi_o$ has risen and a node 204 has been discharged, a node 205 is raised via a MOST $Q_{168}$ and the node 29 which is then at a high impedance state is raised far higher than the $V_{DD}$ level by a boot-strap capacitor $C_{29}F$. Then, the timing $\phi_1$, rises up to the $V_{DD}$ level. The timing $\phi_i$ is generated by delaying the rise of the timing $\phi$, via the genrator circuit of FIG. 8(G).

In the drive circuit shown in FIG. 6, the nodes 109 and 112 are not directly used as true and complementary address outputs A' and A', for the purpose of reducing the load of the timing signal $\phi_1$. Where the timing signal $\phi_1$, has a sufficient driving capacity, these nodes 109 and 112 can be used as address output terminals. Since a large difference in level appears between the latch output nodes 103 and 105, the raising of the output on the low level side would not cause any problem.

As described above, the present invention provides a latch circuit producing a true and complementary pair of latched and amplified output signals without any necessity of a special latch timing signal nor a reference voltage. The latch circuit can be directly connected to a buffer without an additional timing signal to form an address inverter buffer circuit. In that case, a setup time as well as a hold time of an address input are also shortened as compared to the prior art circuit, and it can operate at a higher speed than the prior art circuit because of unnecessity of an additional activation timing. The latch circuit of the present invention may be also used in data-in buffer and data-output buffer of memory devices and in other and in other application where a true and complementary pair of latched and amplified signals are required.

I claim:

1. A latch circuit comprising a first and a second power voltage terminals, a first to a fifth nodes, a first field effect transistor coupled between said first power voltage terminal and said first node via its drain-source current path, a second field effect transistor coupled between said first node and said second node via its drain-source current path, third and fourth field effect transistors coupled between said second node and said second power voltage terminal with their drain-source current paths being connected in parallel, a fifth field effect transistor coupled between said second node and a fifth node via its drain-source current path, a sixth field effect transistor coupled between said first power voltage terminal and said third node via its drain-source current path, a seventh field effect transistor coupled between said third node and said second power voltage terminal via its drain-source current path, an eight field effect transistor coupled between said third node and a fourth node via its drain-source current path, a ninth field effect transistor coupled between said fourth node and said second power voltage terminal via its drain-source current path, a tenth field effect transistor coupled between said first power voltage terminal and said fifth node via its drain-source current path, means for connecting a gate of said fifth field effect transistor to said fourth node, means for connecting a gate of said seventh field effect transistor to said second node, means for supplying a logic signal to a gate of said third field transistor, means for generating a first control signal during a first period, means for supplying said first control signal to gates of said first, fourth, sixth, ninth and tenth field effect transistors, means for generating a second control signal during a second period after said first period, and means for supplying said second control signal to gates of said second and eighth field effect transistors, whereby true and complementary signals with respect to said logic signals are generated at said third and fifth nodes, respectively in response to the generation of said second control signal.

2. The circuit according to claim 1, further comprising a first capacitor coupled between said first node and said second power voltage terminal and a second capacitor coupled between said third node and said second power voltage terminal.

3. The circuit according to claim 1, further comprising a drive circuit for amplifying said true and complementary signals, said drive circuit having first and second input terminals coupled to said third and fifth nodes, respectively.

4. The circuit according to claim 1, further comprising a sixth node, an eleventh field effect transistor coupled between said second node and said third field effect transistor, means for connecting a gate of said eleventh field effect transistor to said sixth node; and means for providing said sixth node with an opposite level to that of said second node.

5. A latch circuit comprising first to fourth nodes, means for supplying said first node with a logic signal, first charging means for operatively charging a second node at said first potential, second charging means for operatively charging said fourth node at said first potential, means for operatively discharging a potential at said third node to a second potential, first control means for operatively enabling said first and second charging means and said discharging means during a first period, first transfer means for operatively transferring a potential at said second node to said third node, second control means for operatively enabling said first transfer means during a second period after said first period, switching means responsive to a level of said first node for selectively discharging a potential of said second node to a second potential, and second transfer means responsive to a potential at said third node for selectively providing an electrical path between said first and fourth nodes.

6. The latch circuit according to claim 5, in which said switching means includes an insulated gate field effect transistor having a gate coupled to said first node.

7. The latch circuit according to claim 5, in which capacitance of said second node is larger than that of said third node.

8. The latch circuit according to claim 5, further comprising a drive circuit for amplifying potentials at said second and fourth nodes.

9. A circuit comprising an input node, a first output node, a second output node, an inverter circuit having an input terminal and an output terminal, means for connecting the input terminal of said inverter circuit to said input node, means for connecting the output terminal of said inverter circuit to said first output node, a logic level of said first output node being made opposite to that of said input node when said inverter circuit is enabled, charge means for operatively charging said second output node at a predetermined potential before said inverter circuit is enabled, transfer means for selectively providing an electrical path between said input node and said second output node, and control means for selectively enabling said transfer means thereby to make a potential at said second output node equal to that of said input node when a potential of said first output node is at said predetermined potential, second output nodes signals are established at said first and second output nodes.

10. A circuit comprising first to fourth nodes, first means for supplying said first node with a logic signal, second means for operatively supplying said second node with a first potential, third means for operatively supplying said fourth node with said first potential, fourth means for operatively supplying said third node with a second potential, a first field effect transistor responsive to a first potential at said first node for selectively supplying said second node with said second potential, a second field effect transistor coupled between said second and third node, a third field effect transistor coupled between said first and fourth nodes and having a gate coupled to said third node, said third field effect transistor being conducting and non-conducting when said third node is at the first potential and the second potential, respectively, first control means for enabling said second to fourth means, and second control means for making said second field effect transistor conducting after said second to fourth means are enabled, whereby true and complementary signals with respect to the signal at said first node are generated at said fourth node and said third node, respectively.

11. The circuit according to claim 10, wherein said first field effect transistor is made non-conducting in response to the second potential at said first node and said third field effect transistor operatively connects said first node to said fourth node when said third node is at the first potential.

* * * * *